(12) United States Patent
Kang et al.

(10) Patent No.: US 12,446,457 B2
(45) Date of Patent: Oct. 14, 2025

(54) PREPARATION OF TETRADENTATE PLATINUM(II) COMPLEX AND USE THEREOF

(71) Applicant: GUANGDONG AGLAIA OPTOELECTRONIC MATERIALS CO., LTD, Guangdong (CN)

(72) Inventors: Jian Kang, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 770 days.

(21) Appl. No.: 17/776,937

(22) PCT Filed: Sep. 19, 2020

(86) PCT No.: PCT/CN2020/116336
§ 371 (c)(1),
(2) Date: May 13, 2022

(87) PCT Pub. No.: WO2021/114802
PCT Pub. Date: Jun. 17, 2021

(65) Prior Publication Data
US 2023/0006154 A1    Jan. 5, 2023

(30) Foreign Application Priority Data

Dec. 11, 2019 (CN) .......................... 201911268943.1

(51) Int. Cl.
| | | |
|---|---|---|
| C07D 401/12 | (2006.01) | |
| C07F 15/00 | (2006.01) | |
| C09K 11/06 | (2006.01) | |
| H10K 85/30 | (2023.01) | |
| H10K 50/11 | (2023.01) | |
| H10K 101/10 | (2023.01) | |

(52) U.S. Cl.
CPC ......... H10K 85/346 (2023.02); C07D 401/12 (2013.01); C07F 15/0086 (2013.01); C09K 11/06 (2013.01); C09K 2211/1044 (2013.01); C09K 2211/185 (2013.01); H10K 50/11 (2023.02); H10K 2101/10 (2023.02)

(58) Field of Classification Search
CPC .................................................. C07D 401/12
See application file for complete search history.

(56) References Cited

U.S. PATENT DOCUMENTS

2019/0074454 A1    3/2019    Kwak

FOREIGN PATENT DOCUMENTS

| CN | 103097395 A | 5/2013 |
|---|---|---|
| CN | 104245714 A | 12/2014 |
| CN | 109651337 A | 4/2019 |

OTHER PUBLICATIONS

Li et al. "Highly phosphorescent platinum(ii) emitters: photophysics, materials and biological applications" Chem. Sci. 2016, 7, 1653.
Tang et al.: "Organic electroluminescent diodes", Appl. Phys. Lett. 51, 913 (1987); doi: 10.1063/1.98799, Sep. 21, 1987.

*Primary Examiner* — John S Kenyon
(74) *Attorney, Agent, or Firm* — Maschoff Brennan

(57) ABSTRACT

The present invention relates to the preparation of a novel tetradentate platinum (II) complex and an application thereof, belonging to the field of OLED organic electroluminescent materials. The complex of the present invention has the following structural formula, and is used for a phosphorescent doping material having a photon emission effect in a light-emitting layer of an OLED luminescent device. The complex of the present invention has a high fluorescence quantum efficiency, a good heat stability and a low quenching constant, and can be used for the manufacture of a green light OLED device with a high luminous efficiency and low roll-off.

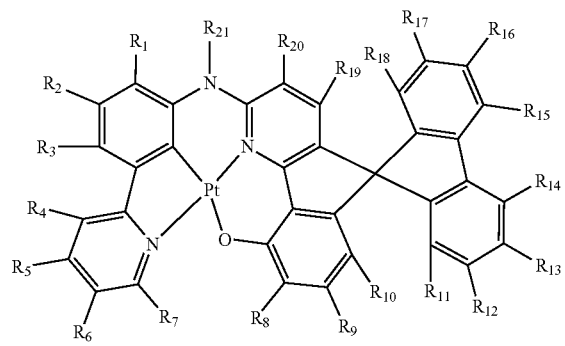

20 Claims, 1 Drawing Sheet

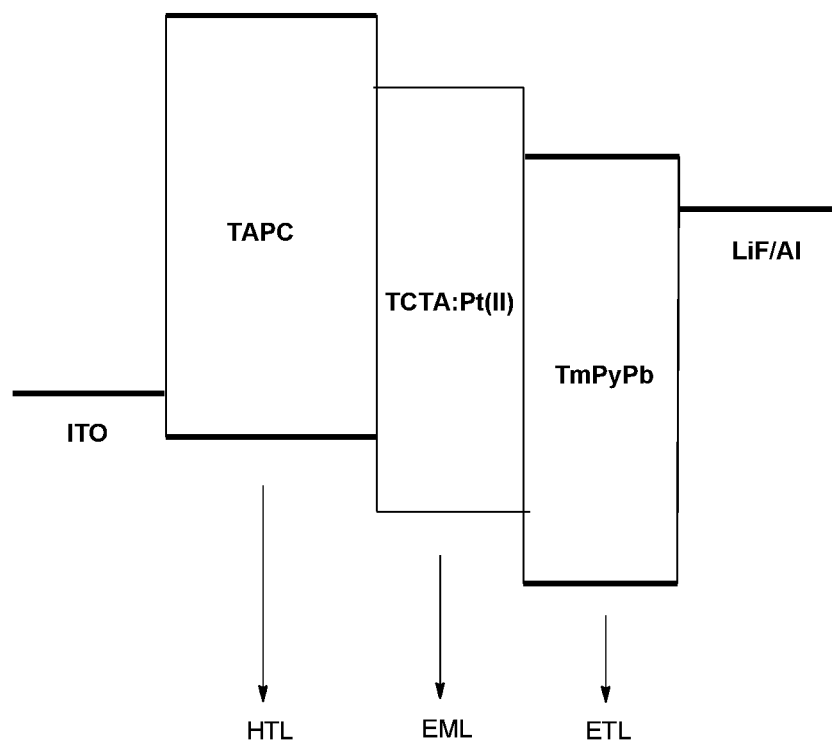

PREPARATION OF TETRADENTATE PLATINUM(II) COMPLEX AND USE THEREOF

TECHNICAL FIELD

The present invention relates to a novel tetradentate platinum (II) complex metal organic material, and especially for a phosphorescent doping material having a photon emission effect in a light-emitting layer of an OLED luminescent device.

BACKGROUND

Organic Light-Emitting Diode (OLED) is also called organic electroluminescence display and organic light-emitting semiconductor; OLED was found by professor Ching W. Tang, a Chinese descendant scientist in America in the laboratory of Eastman Kodak Company 1987 (*Appl. Phys. Lett.* 1987, 51, 913). Relative to the conventional Liquid Crystal Display (LCD) technology, the OLED display technology has been always widely concerned and studied due to its advantages such as, self-illumination, wide viewing angle, almost infinitely high contrast ratio, low power consumption, extremely high reaction speed and potential flexibility and foldable property. The development of a novel OLED material has been always the emphasis and difficulty in the OLED technology research.

Compared with Light-Emitting Diode (LED) based on inorganic materials, the OLED based on organic materials have lots of irreplaceable superior performances. The main reasons are as follows: (1) organic materials are easy to achieve film formation on any substrate and can be made into ultra-thin display panels; (2) organic molecular structure can be subjected to molecular designing to regulate and control the luminescent properties of materials, easy to be modified and transformed; (3) organic luminescent materials have high fluorescence quantum efficiency, almost being up to 100%; (4) LED based on inorganic materials is point light source, while LED panel based on organic materials can be prepared into a surface light source; (5) the organic electroluminescent OLED device has a lower driving voltage and the inorganic LED has a higher driving voltage.

In the current OLED materials, the materials doped as a light-emitting layer and having the photon emission effect is mainly the transition-metal phosphorescent materials, of which iridium (III) and platinum (II)-based complexes have been studied more. Generally, a metal complex formed by a bidentate ligand and trivalent iridium shapes an octahedral coordination structure, and iridium atoms are located in the center of the octahedron, chelated and coordinated with the bidentate ligand. The octahedral coordination structure of the iridium (III) complex renders the molecules to have stronger tridimensional property, thus avoiding the mutual stacking between complex molecules; in the preparation of an OLED device, high-concentration doping is hard to form excimer luminescence. But, for some asymmetric bidentate ligands, the iridium (III) complex may produce isomers; there are possibly planar and longitude structures due to different coordination orientations of the ligand, leading to the increase of separation difficulty of the iridium (III) complex and decrease of the yield of the target iridium (III) complex.

In recent years, platinum (II)-based phosphorescent OLED materials have been gradually developed and better research results have been achieved while making breakthroughs in iridium (III) complex phosphorescent materials constantly. Different from common octahedral coordination structures formed by iridium (III), platinum (II) is quadridentate. Therefore, for general complexes forming a plane structure, common ligands are mainly divided into bidentate, tridentate and tetradentate ligands. Compared with the bidentate or tridentate ligands, the tetradentate ligand platinum (II) complex has the following advantages:
1) the platinum (II) complex can be synthesized by one-step reaction of ligands, easy to the preparation and purification of the platinum (II) complex;
2) no isomer is produced in the synthesis of the platinum (II) complex with structure specificity;
3) the structure is stable by chelating coordination;
4) the tetradentate ligand platinum (II) complex has better phosphorescent emission efficiency.

Due to its unique properties, the tetradentate ligand platinum (II) complex has attracted more researches and concerns. Especially, the research group of academician CHE Chi-Ming, University of Hong Kong, has carried out an in-depth study on the complex and achieved excellent results (*Chem. Sci.* 2016, 7, 1653).

The tetradentate ligand platinum (II) complex shows good properties; but meanwhile, due to the property of plane structure, the platinum (II) complex also leads to easy stacking between molecules, easy formation of an excimer and the like, thereby reducing the properties of the OLED device.

SUMMARY

The present application provides a novel tetradentate ligands-based Pt (II) complex; the novel complex emits green light and is applied to an OLED device as a green phosphorescent OLED material. Such kind of novel Pt (II) complex has an ONCN chelating coordination model, and has a spiral structure on the molecular skeleton. Such kind of structure greatly enhances the tridimensional property of molecules, and is beneficial to weakening molecular interaction, thus avoiding molecular stacking of the complex, inhibiting the formation of an excimer, and improving the efficiency and service life of the OLED device.

The novel tetradentate platinum (II) complex metal organic material related in the present invention has a structure as shown in the following formula:

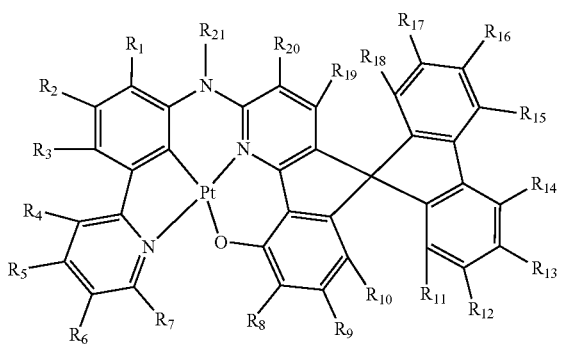

where $R_1$-$R_{21}$ are independently selected from hydrogen, deuterium, sulfur, halogen, hydroxy, acyl, alkoxy, acyloxy, amino, nitro, acylamino, cyano, carboxyl, styryl, aminocarbonyl, carbamoyl, benzylcarbonyl, aryloxy, diarylamino, silicyl containing 1-30 C atoms, saturated alkyl containing 1-30 C atoms, unsaturated alkyl containing 2-20 C atoms, substituted or unsubstituted aryl containing 5-30 C atoms, substituted or unsubstituted heteroaryl containing 5-30 C atoms, or adjacent $R_1$-$R_{21}$ are mutually linked to form a ring via a covalent bond, where the substitution refers to a substitution by halogen, deuterium, C1-C20 alkyl, and cyano; and heteroatom in the heteroaryl is one or more of N, O and S.

Preferably, $R_1$-$R_{21}$ are independently selected from hydrogen, halogen, amino, nitro, cyano, diarylamino, saturated alkyl containing 1-10 C atoms, aryl substituted by halogen or one or more C1-C4 alkyl and containing 5-20 C atoms or unsubstituted aryl containing 5-20 C atoms, heteroaryl substituted by halogen or one or more C1-C4 alkyl and containing 5-20 C atoms or unsubstituted heteroaryl containing 5-20 C atoms, or adjacent $R_1$-$R_{21}$ are mutually linked to form a ring via a covalent bond; and the halogen is F, Cl, Br.

Preferably, in the 21 groups of the $R_1$-$R_{21}$, 0-3 groups independently represent diarylamino, aryl substituted by halogen or one to three C1-C4 alkyl and containing 5-10 C atoms or unsubstituted aryl containing 5-10 C atoms, N-bearing heteroaryl substituted by halogen or one to three C1-C4 alkyl and containing 5-10 C atoms or unsubstituted N-bearing heteroaryl containing 5-10 C atoms; other groups independently represent hydrogen or saturated alkyl containing 1-8 C atoms; and the halogen is F, Cl.

Preferably, in the 21 groups of the $R_1$-$R_{21}$, 0-3 groups independently represent diphenylamino, phenyl, pyridyl, carbazolyl; and other groups independently represent hydrogen, fluorine or saturated alkyl containing 1-4 C atoms.

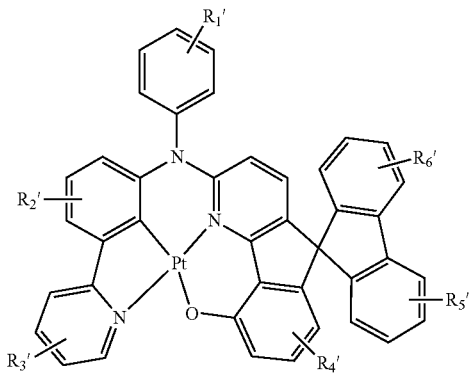

$R_1'$-$R_6'$ are independently selected from hydrogen, halogen, diarylamino, saturated alkyl containing 1-10 C atoms, aryl substituted by halogen or one or more C1-C4 alkyl and containing 5-20 C atoms or unsubstituted aryl containing 5-20 C atoms, aryl substituted by halogen or one or more C1-C4 alkyl and containing 5-20 C atoms or unsubstituted aryl containing 5-20 C atoms, or adjacent $R_1'$-$R_6'$ are mutually linked to form a ring via a covalent bond; the halogen is F, Cl, Br; and heteroatom in the heteroaryl is any one of N, O and S.

Preferably, in the 6 groups of the $R_1'$-$R_6'$, 0-3 groups independently represent diarylamino, aryl substituted by halogen or one to three C1-C4 alkyl and containing 5-10 C atoms or unsubstituted aryl containing 5-10 C atoms, heteroaryl substituted by halogen or one to three C1-C4 alkyl and containing 5-10 C atoms or unsubstituted heteroaryl containing 5-10 C atoms; other groups independently represent hydrogen, halogen or saturated alkyl containing 1-8 C atoms; and the halogen is F, Cl.

Preferably, in the 6 groups of the $R_1'$-$R_6'$, 0-3 groups independently represent diphenylamino, C1-C4 alkyl substituted or unsubstituted phenyl, pyridyl, carbazolyl; and other groups independently represent hydrogen, fluorine or saturated alkyl containing 1-4 C atoms.

A precursor of the above complex is shown in the following formula:

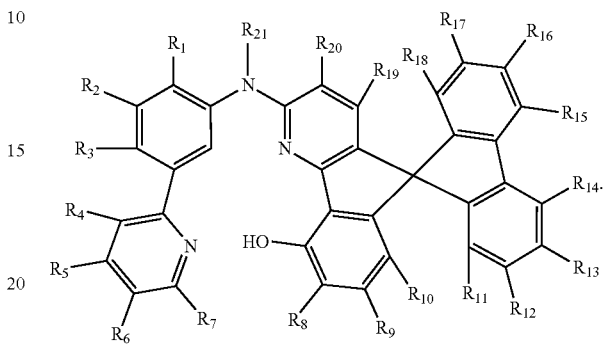

For the purpose of the present application, unless otherwise specified, the terms halogen, alkyl, alkenyl, aryl, acyl, alkoxy and heterocyclic aromatic system or heterocyclic aromatic group may have the following meanings:

the above halogen or halo includes fluorine, chlorine, bromine and iodine, preferably, F, Cl, Br, and particularly preferably F or Cl, and most preferably F.

The above technical features of being linked to form a ring via a covalent bond, aryl and heteroaryl include aryl having 5-30 carbon atoms, preferably, 5-20 carbon atoms, and more preferably 5-10 carbon atoms, and formed by an aromatic ring or more fused aromatic rings.

A suitable aryl is, for example, phenyl, naphthyl, acenaphthenyl, acenaphthenyl, anthracyl, fluorenyl, and phenalenyl. The aryl may be unsubstituted (namely, all the substitutable carbon atoms carry hydrogen atoms) or substituted on one, more than one or all the substitutable positions of aryl. A suitable substituent is, for example, halogen, preferably, F, Br or Cl; alkyl, preferably, alkyl having 1-20, 1-10 or 1-8 carbon atoms, particularly preferably, methyl, ethyl, isopropyl or tert-butyl; aryl, preferably, re-substituted or unsubstituted $C_5/C_6$ aryl or fluorenyl; heteroaryl, preferably, heteroaryl having at least one nitrogen atom, particularly preferably, pyridyl; aryl is particularly preferably $C_5/C_6$ aryl which carries a substituent selected from F, methyl and tert-butyl, or is optionally substituted by at least one of the above substituents; $C_5/C_6$ aryl is particularly preferably $C_5/C_6$ aryl having 0, 1 or 2 of the above substituents, and $C_5/C_6$ aryl is further particularly preferably unsubstituted phenyl or substituted phenyl, such as biphenyl, and phenyl substituted by two tert-butyl in a meta-position.

The unsaturated alkyl having 1-20 carbon atoms, are preferably, alkenyl, more preferably, alkenyl having a double bond, and particularly preferably, alkenyl having a double bond and 1-8 carbon atoms.

The above alkyl includes alkyl having 1-30 carbon atoms, preferably, 1-10 carbon atoms, and more preferably 1-4 carbon atoms. The alkyl may be branched or linear, and also be annular, and may be disconnected by one or more heteroatoms, preferably, N, O or S.

Moreover, the alkyl may be substituted by one or more halogens or above aryl-related substituents. Similarly, alkyl may carry one or more aryl; all the above aryls are suitable for the purpose; alkyl is particularly preferably selected from methyl, ethyl, isopropyl, n-propyl, isobutyl, n-butyl, tert-butyl, sec-butyl, isoamyl, cyclopropyl, cyclopentyl and cyclohexyl.

The above acyl is linked to a CO group via a single bond, for example, alkyl used herein.

The above alkoxy is linked to oxygen via a single bond, for example, alkyl used herein.

The above heteroaryl group is understood to be related to an aromatic and $C_3$-$C_5$ ring, and further include one oxygen or sulfur atom or 1-4 nitrogen atoms or a combination of one oxygen or sulfur atom with two nitrogen atoms at most, and their substituted as well as benzo- and pyridino-fused derivatives, for example, the heteroaryl group may be substituted by one or more aryl-related substituents mentioned via linking one of ring-forming carbon atoms.

In some embodiments, heteroaryl may be five/six-membered aromatic heterocyclic system carrying the above 0, 1 or 2 substituents independently. Typical examples of heteroaryl include, but are not limited to unsubstituted furan, benzofuran, thiophene, benzothiophene, pyrrole, pyridine, benzpyrole, azole, benzoazole, isazole, benzoisazole, thiazole, benzothiazole, isothiazole, imidazole, benzimidazole, parazole, indazole, tetrazole, quinoline, isoquinoline, pyridazine, pyrimidine, purine and pyrazine, furan, 1,2,3-diazole, 1,2,3-thiadiazole, 1,2,4-thiadiazole, triazole, benzotriazole, pteridine, benzoazole, diazole, benzopyrazole, quinolizine, cinnoline, phthalazine, quinazoline, quinoxaline and mono- or di-substituted derivatives thereof. In some embodiments, substituent is halo, hydroxy, cyano, O—$C_{1-6}$ alkyl, $C_{1-6}$ alkyl, hydroxy $C_{1-6}$ alkyl and amino-$C_{1-6}$ alkyl.

Specific detailed examples as shown below include, but not limited to the following structures:

Pt-1
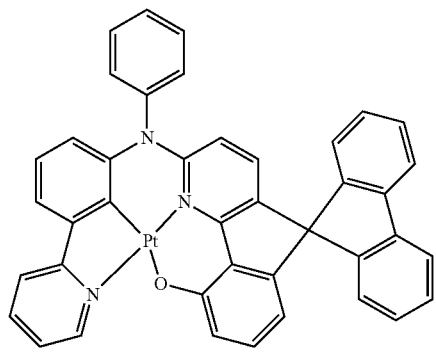

Pt-2
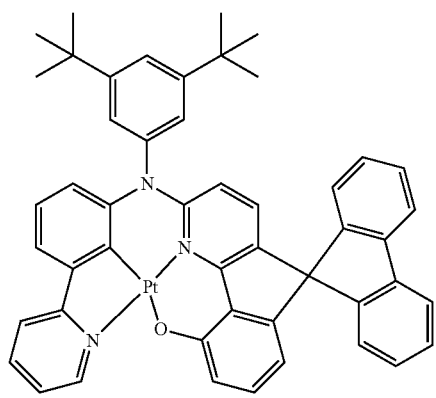

Pt-3
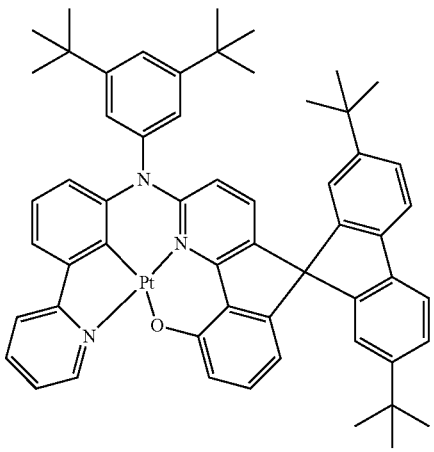

Pt-4
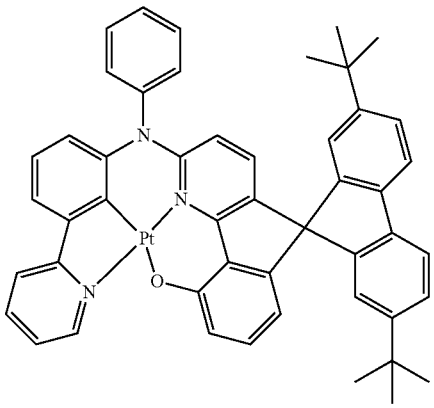

Pt-5
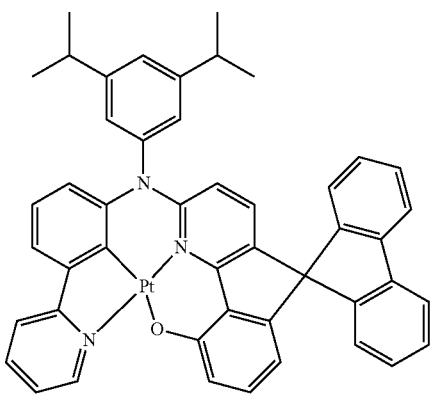

Pt-6
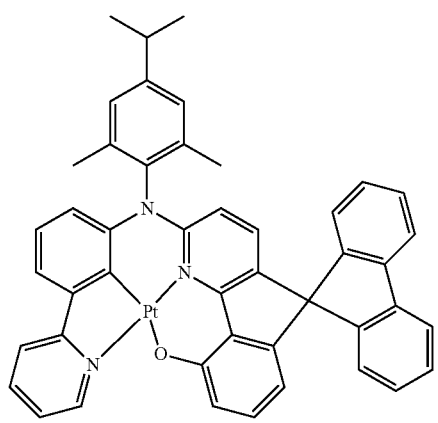
Pt-7
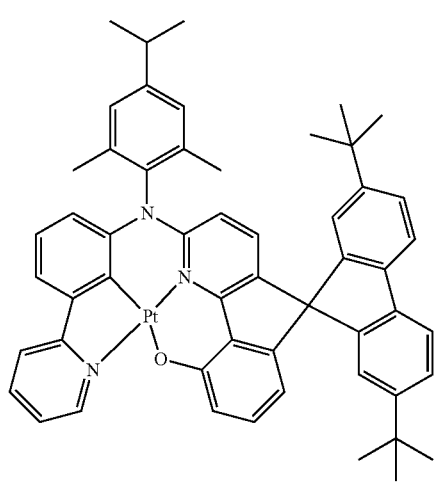
Pt-8
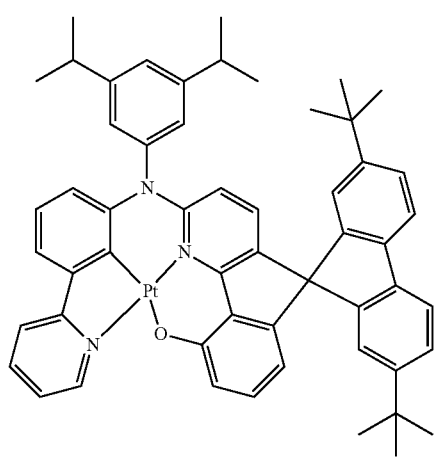
Pt-9
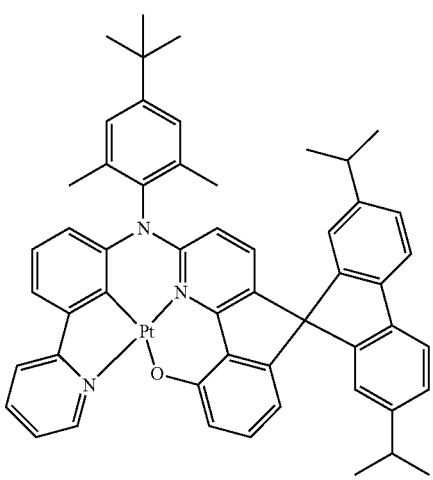
Pt-10
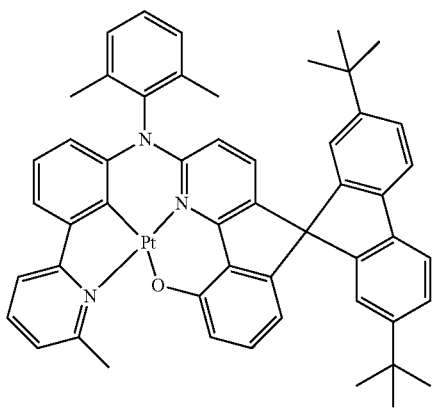
Pt-11
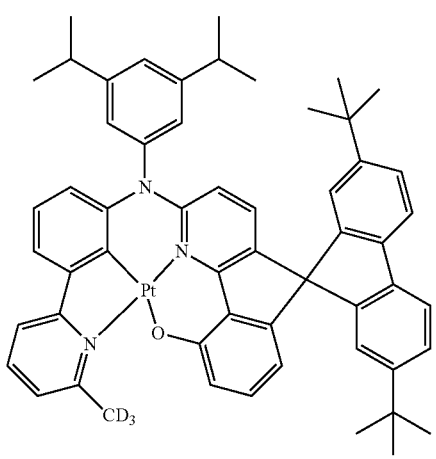

Pt-12
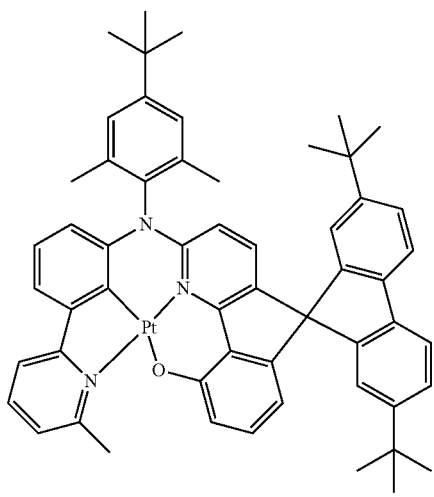
Pt-13
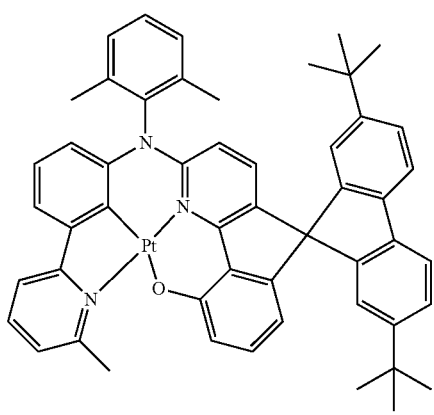
Pt-14
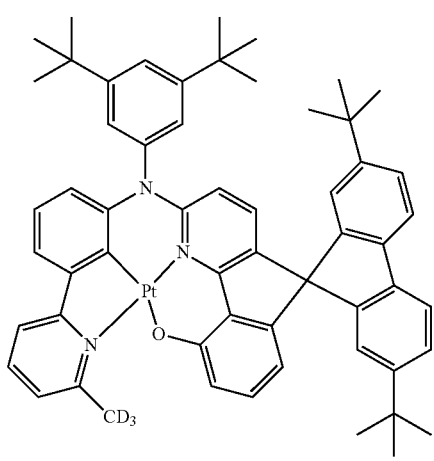
Pt-15
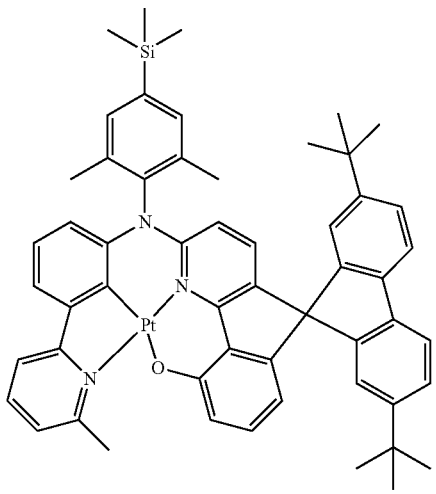
Pt-16
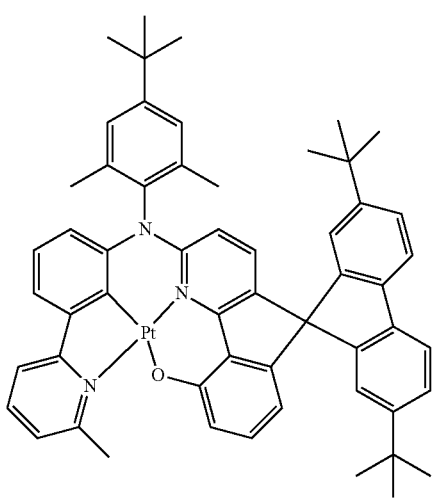
Pt-17
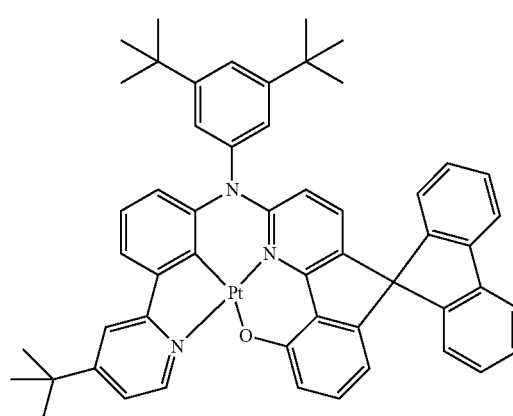

Pt-18
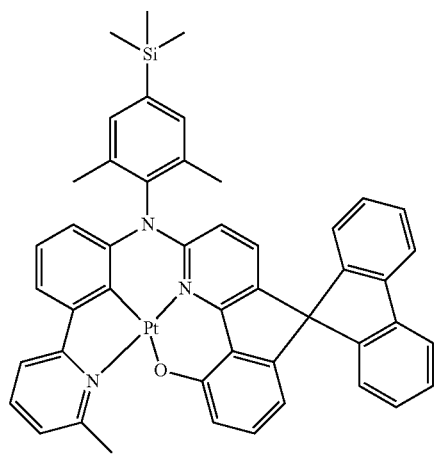
Pt-19
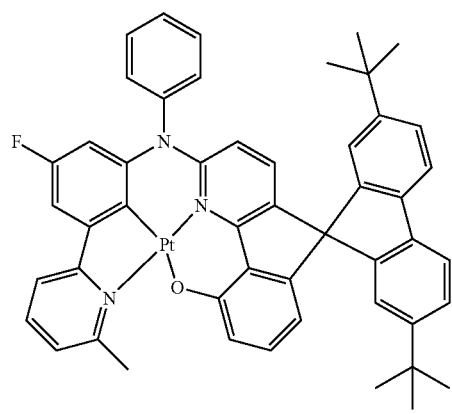
Pt-20
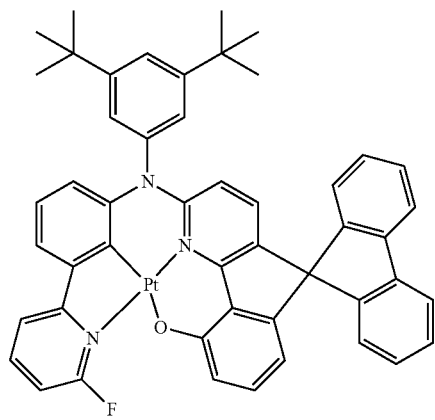
Pt-21
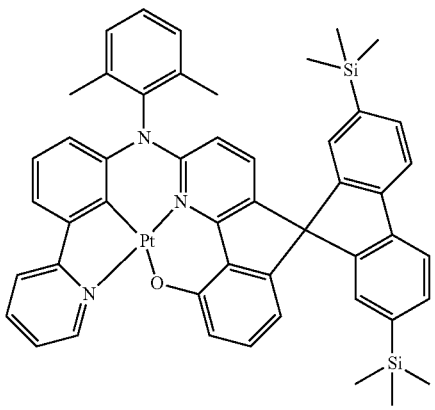
Pt-22
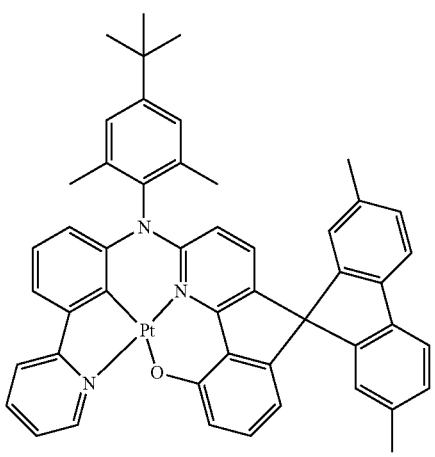
Pt-23
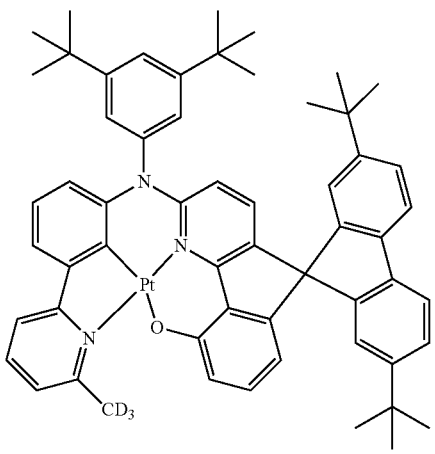

Pt-24
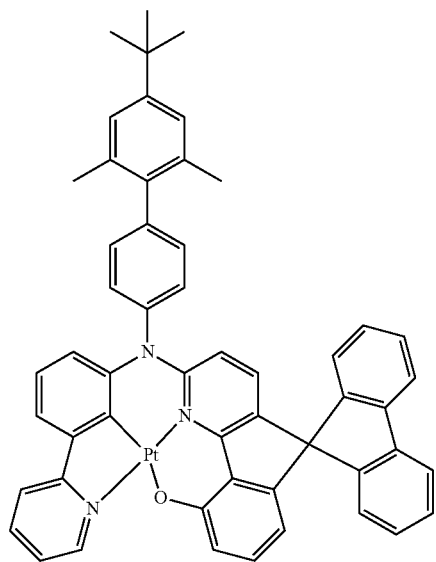
Pt-25
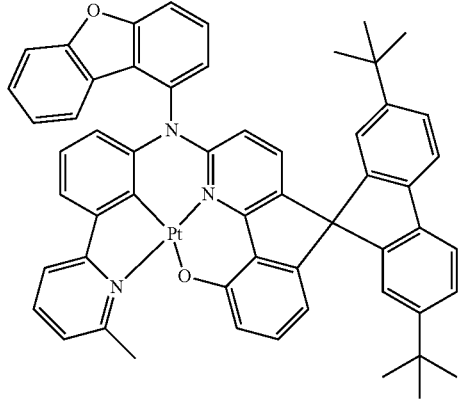
Pt-26
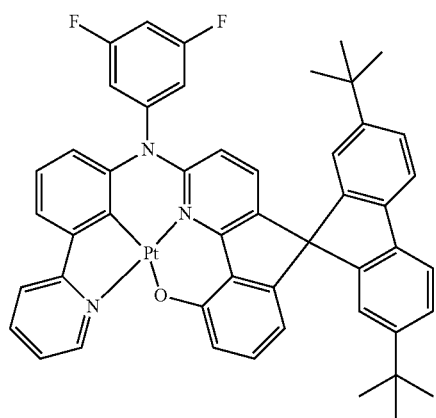
Pt-27
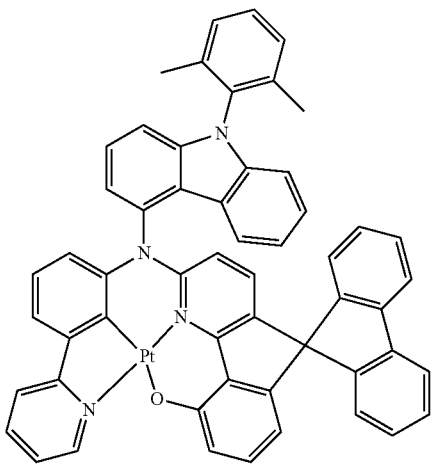
Pt-28
Pt-29

-continued

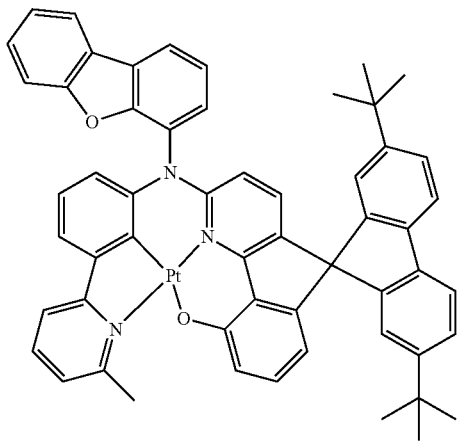
Pt-30

Provided is an application of the above complex in an OLED luminescent device.

The platinum (II) complex having the above structure may be used for the manufacture of an OLED device for heat deposition and solution treatment.

The present invention includes an organic light-emitting device containing one or more of the above complexes.

The complex is applied in the device by heat deposition in a form of layer.

The complex is applied in the device by spin coating in a form of layer.

The complex is applied in the device by ink-jet printing in a form of layer.

The above organic light-emitting device emits orange red light when an electric current is applied.

The organic metal complex of the present invention has a high fluorescence quantum efficiency, good heat stability and a low quenching constant, and can be used for the manufacture of an OLED device with high luminous efficiency, low roll-off property and emitting orange red light.

BRIEF DESCRIPTION OF DRAWINGS

FIG. 1 is a structure diagram showing an organic light-emitting device in the present invention.

DETAILED DESCRIPTION OF EMBODIMENTS

The present invention will be further described specifically in combination with the examples below.

The preparation of the above complex includes the following steps:

as shown below, subjecting initial substrates S1 and S2 to Suzuki-Miyaura coupling reaction to obtain a substrate S3; subjecting the S3 and S4 to Buchwald-Hartwig coupling reaction to obtain a substrate S5; then subjecting the S5 and S6 to Buchwald-Hartwig coupling reaction to obtain a substrate S7, heating the S7 at a high temperature under the action of a pyridine hydrochloride for demethylation to obtain an S8; performing a chelation reaction on the S8 and $K_2PtCl_4$ to obtain a target platinum (II) complex TM.

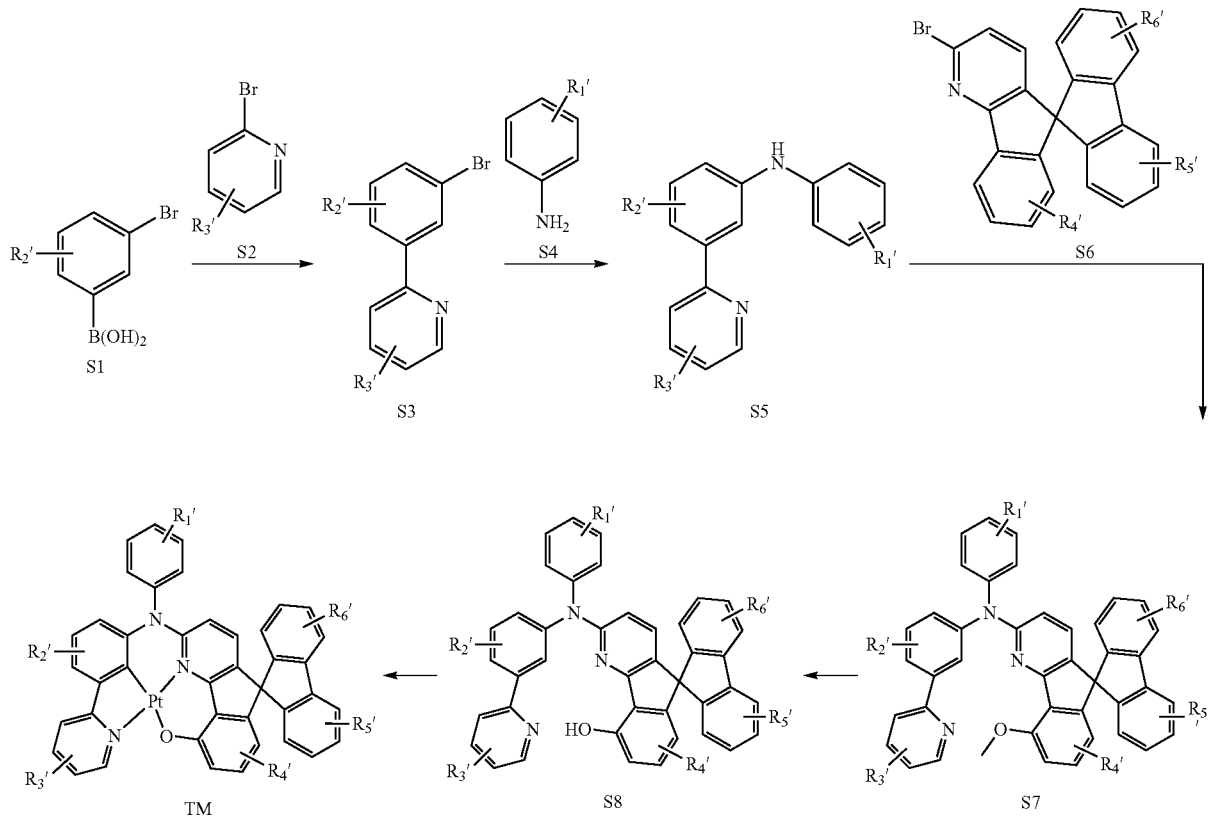

Initial substrates, intermediates, solvents and the like related in the compound synthesis of the present invention are purchased from Energy Chemical, J&K Chemicals, aladdin and other suppliers known well by a person skilled in the art.

Example 1

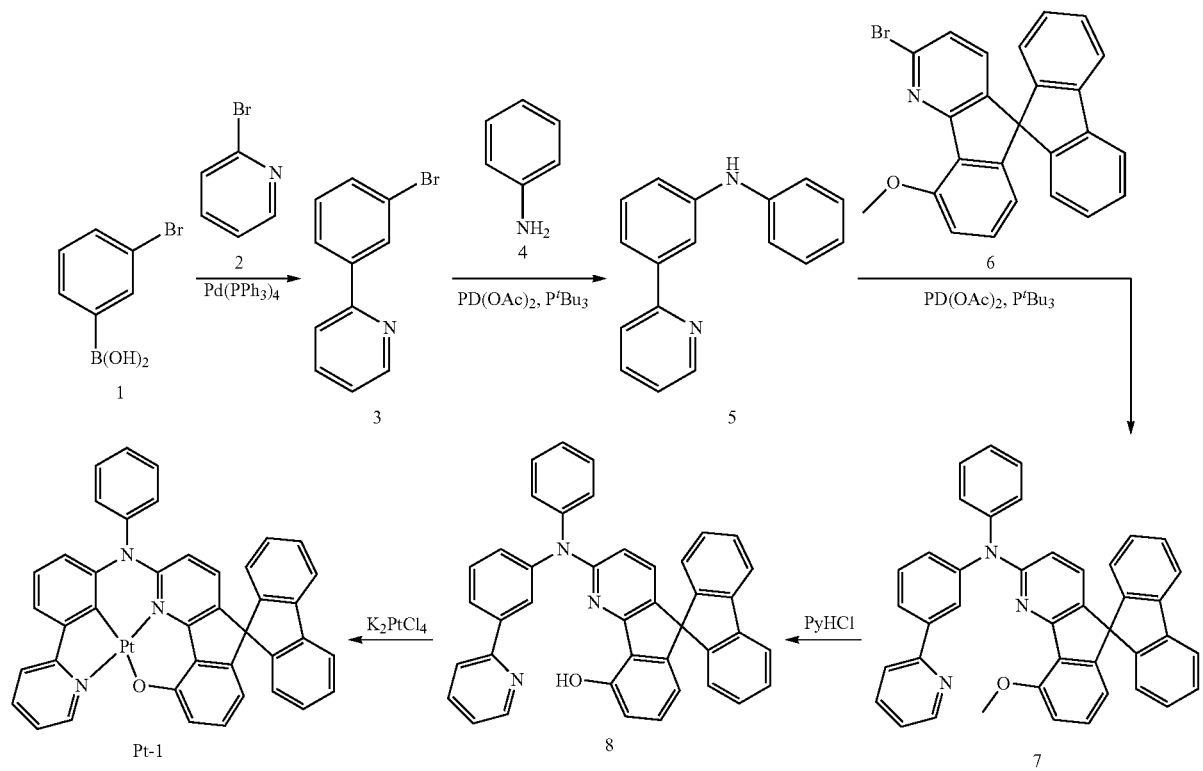

Synthesis of the compound 3: 20.0 g (0.10 mol) compound 1, 19.8 g (0.125 mol) compound 2, 3.46 g (0.03 eq., 3.0 mmol) tetrakis(triphenylphosphine)palladium, and 27.6 g (2.0 eq., 0.20 mol) potassium carbonate were taken and put to a flask, and added with 210 mL dioxane and 60 mL water, and heated for reflux reaction for 8 h under the protection of nitrogen. After stopping the reaction, the system was cooled to room temperature and subjected to rotary evaporation to remove the solvent; a proper amount of water and ethyl acetate were added for extraction, organic phases were collected and dried, after removing the solvent by rotary evaporation, a flash silica gel column (mobile phase n-hexane/ethyl acetate=10:1) was used for separation and recrystallization, thus obtaining 20.0 g of a target product compound 3 with a yield of 85% and a purity of 99.9%.

Synthesis of the compound 5: 11.7 g (50 mmol) compound 3, 9.3 g (50 mmol) compound 4, 450 mg (0.04 eq., 2 mmol) palladium acetate, 0.40 g (0.08 eq., 4 mmol) tri-tert-butylphosphine and 11.22 g (2.0 eq., 0.10 mol) potassium tert-butoxide were taken and put to a flask, and added with 200 mL toluene, and heated for reflux reaction for 8 h under the protection of nitrogen. After stopping the reaction, the system was cooled to room temperature and subjected to rotary evaporation to remove the solvent; a proper amount of water and ethyl acetate were added for extraction, organic phases were collected and dried, after removing the solvent by rotary evaporation, a flash silica gel column (mobile phase n-hexane/ethyl acetate=15:1) was used for separation and recrystallization, thus obtaining 23.83 g of a target product compound 5 with a yield of 88% and a purity of 99.9%.

Synthesis of the compound 7: 4.9 g (20 mmol) compound 5, 7.9 g (20 mmol) compound 6, 225 g (0.02 eq., 1 mmol) palladium acetate, 0.20 g (0.04 eq., 2 mmol) tri-tert-butylphosphine, and 4.5 g (2.0 eq., 0.04 mol) potassium tert-butoxide were taken and put to a flask, and added with 100 mL toluene, and heated for reflux reaction for 8 h under the protection of nitrogen. After stopping the reaction, the system was cooled to room temperature and subjected to rotary evaporation to remove the solvent; a proper amount of water and ethyl acetate were added for extraction, organic phases were collected and dried, after removing the solvent by rotary evaporation, a flash silica gel column (mobile phase n-hexane/ethyl acetate=10:1) was used for separation and recrystallization, thus obtaining 8.9 g of a target product compound 7 with a yield of 75% and a purity of 99.9%.

Synthesis of the compound 8: 5.9 g (10 mmol) compound 7 and 50 g pyridine hydrochloride were taken and heated up to 200° C. for 8 h under the protection of nitrogen. After stopping the reaction, a proper amount of water and ethyl acetate were added for extraction, organic phases were collected and dried, after removing the solvent by rotary evaporation, a flash silica gel column (mobile phase n-hexane/ethyl acetate=15:1) was used for separation and methanol was used for recrystallization, thus obtaining 5.0 g of a target product compound 8 with a yield of 86% and a purity of 99.9%. Theoretical values of mass spectrometry (ESI⁻) ([M-H]⁻) $C_{41}H_{27}N_3O$: 576.22; measured value: 576.21.

Synthesis of the compound Pt-1: 1.15 g (2.0 mmol) compound 8, 160 mg tetrabutylammonium bromide (0.25 eq., 0.5 mmol) and 930 mg (1.2 eq., 2.4 mmol) potassium tetrachloroplatinate were taken and dissolved into 50 mL acetic acid, and vacuumized and fed nitrogen for replacement for several times, stirred and heated up to 130° C. for reaction for 12 h. After stopping the reaction, the system was cooled to remove the solvent by rotary evaporation; a proper amount of water and ethyl acetate were added for extraction, organic phases were collected and dried by anhydrous magnesium sulfate, then subjected to rotary evaporation to remove the solvent, and a flash silica gel column (mobile phase n-hexane/dichloromethane=10:1) was used for separation and methanol was used for recrystallization, and the obtained coarse product was sublimated in vacuum, thus obtaining 616 mg of a red solid with a yield of 40% and a purity of 99.95%. Theoretical values of mass spectrometry (ESI⁻) ([M-H]⁻) $C_{41}H_{25}N_3OP_t$: 771.16; measured value: 771.19.

Example 2

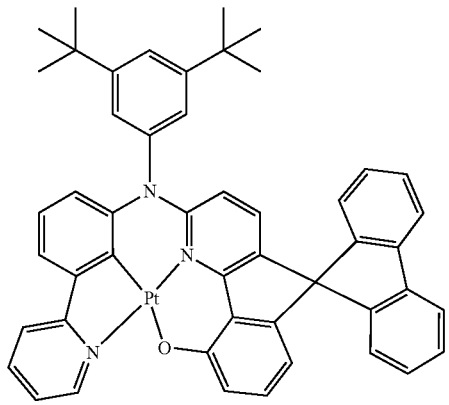

Pt-2

The preparation method of Pt-2 is the same as the synthetic route of Pt-1, and the only difference is that the compound 4 is replaced with the compound 9. The compound 9 has the following molecular formula:

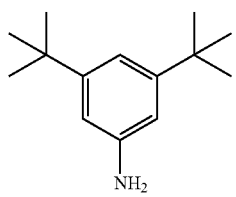

(Compound 9)

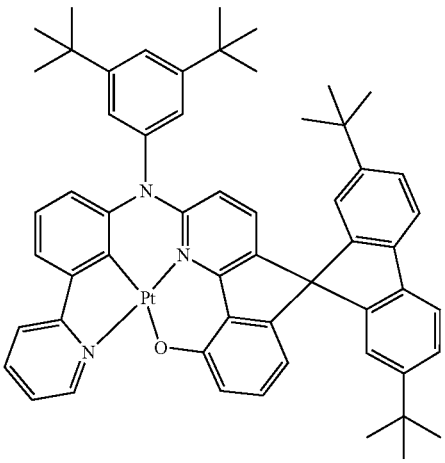

Pt-3

Example 3

The preparation method of Pt-3 is the same as the synthetic route of Pt-1, and the only difference is that the compound 4 is replaced with the compound 9, and the compound 6 is replaced with the compound 10. The compound 10 has the following molecular formula:

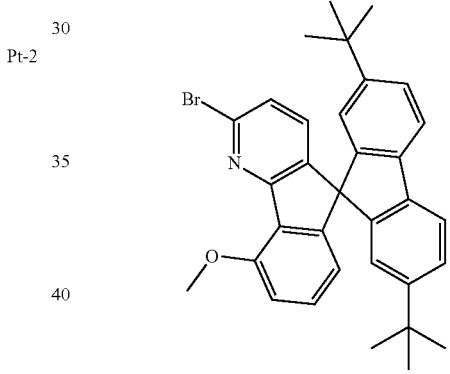

(Compound 10)

Example 4

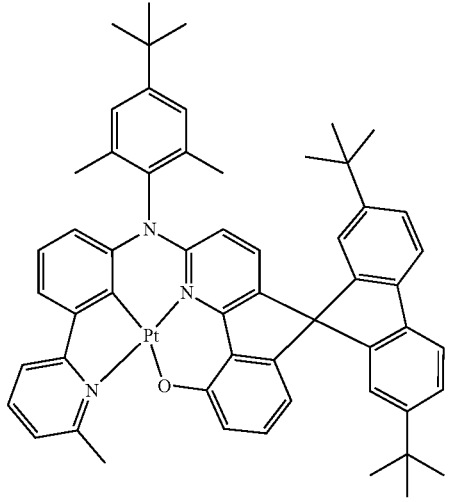

Pt-12

The preparation method of Pt-12 is the same as the synthetic route of Pt-1, and the only difference is that the compound 2 is replaced with the compound 11, and the compound 4 is replaced with the compound 12, and the compound 6 is replaced with the compound 10. The compound 11 has the following molecular formula:

(Compound 11)

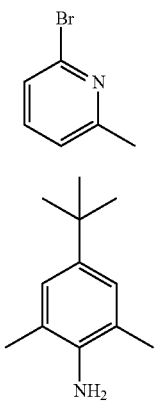

(Compound 12)

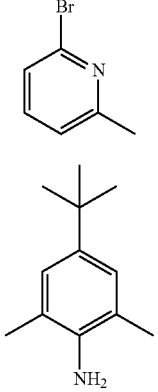

The application example of the compound in the present invention is as follows:
ITO/TAPC (70 nm)/TCTA:Pt(II) (40 nm)/TmPyPb (30 nm)/LiF (1 nm)/Al (90 nm)
Preparation Mode of the Device:
A transparent anode, indium tin oxide (ITO) (10 Ω/sq) glass substrate was subjected to ultrasonic cleaning with acetone, ethanol and distilled water successively, and then subjected to plasma treatment with oxygen gas for 5 min.
The ITO substrate was then mounted on a substrate holder of a vacuum gas-phase evaporation equipment. In the evaporation equipment, the system pressure was controlled $10^{-6}$ torr.
Afterwards, a hole transport layer (HTL) material TAPC having a thickness of 70 nm was evaporated on the ITO substrate.
A light-emitting layer material (EML) TCTA having a thickness of 40 nm was then evaporated, where the platinum (II) complex having a mass fraction of 10% was doped.
An electron transfer layer (ETL) material TmPyPb having a thickness of 30 nm was then evaporated.
An electron injection layer (EIL) having a thickness of 1 nm was then evaporated.
Finally, Al having a thickness of 90 nm was evaporated as a cathode and device packaging was completed. As shown in FIG. 1

TAPC(HIL)

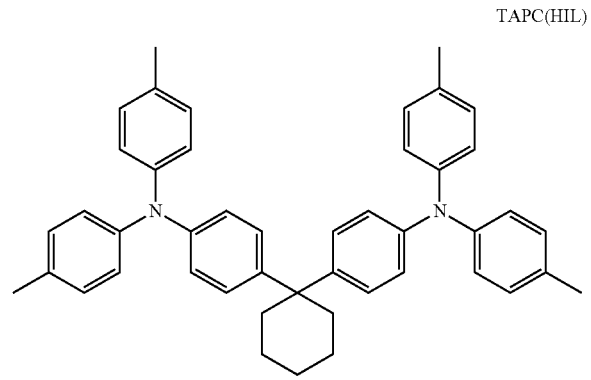

TcTa(EML)

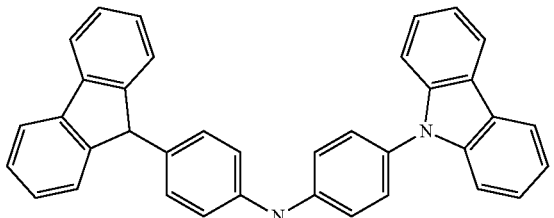

TmPyPB(ETL)

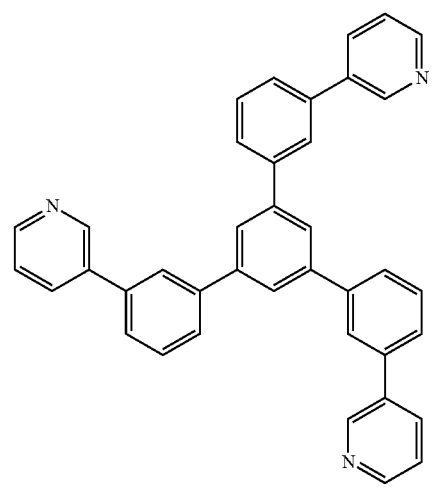

The devices STD, 1, 2, 3 and 4 are successively prepared; the device structure and manufacture method are basically completely the same; the difference is that the platinum (II) complexes STD, Pt-1, Pt-2, Pt-3 and Pt-12 successively serve as dopants in the light-emitting layer. The reference material STD is a typical green emitting material having an ONCN coordination structure.

STD

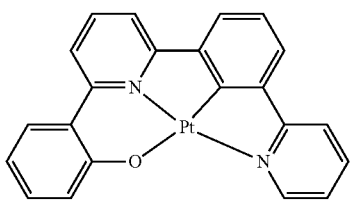

Comparison results of the devices are shown in Table 1. With the performance of the device STD as standards, – represents holding the standard line; –– represents reduction by 5% above relative to the standard performance; + represents promotion by 5% relative to the standard performance; ++ represents promotion by 10% relative to the standard performance.

|  | Device 1 | Device 2 | Device 3 | Device 4 |
|---|---|---|---|---|
| Maximum external quantum efficiency | + | + | ++ | ++ |
| External quantum efficiency below 100 nit | + | + | + | ++ |
| Initial voltage | — | — | — | — |
| Current efficiency below 100 nit | + | + | + | ++ |

It can be seen from the above table that relative to the reference device, the organic light-emitting device prepared on the basis of the platinum (II) complex of the present invention has improved performance at different levels. Such kind of novel Pt (II) complex has strong molecular tridimensional property and weak molecular interaction, thus avoiding molecular stacking of the complex, inhibiting the formation of an excimer to the maximum extent, and improving the efficiency of the OLED device. To sum up, relative to the reference device, the organic light-emitting device prepared by the present invention has better improvement in performance; and the related novel tetradentate platinum (II) complex metal organic material has greater application values.

The invention claimed is:

1. A tetradentate platinum (II) complex, having a structure as shown in the following formula:

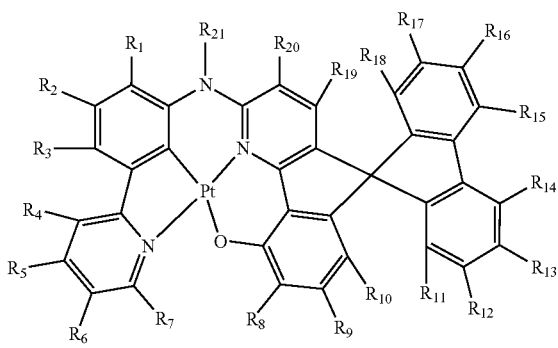

wherein:
$R_1$-$R_{21}$ are independently selected from hydrogen, deuterium, sulfur, halogen, hydroxy, acyl, alkoxy, acyloxy, amino, nitro, acylamino, cyano, carboxyl, styryl, aminocarbonyl, carbamoyl, benzylcarbonyl, aryloxy, diarylamino, saturated alkyl containing 1-30 C atoms, substituted or unsubstituted aryl containing 5-30 C atoms, and substituted or unsubstituted heteroaryl containing 5-30 C atoms;
the substitution refers to a substitution by halogen, deuterium, C1-C20 alkyl, C1-C10 silicyl, and cyano; and
heteroatom in the heteroaryl is one or more of N, O and S; or
wherein:
adjacent $R_1$-$R_{21}$ are mutually linked to form a ring via a covalent bond.

2. The complex according to claim 1, wherein:
$R_1$-$R_{21}$ are independently selected from:
hydrogen,
halogen, the halogen being at least one of F, Cl and Br,
amino,
nitro,
cyano,
diarylamino,
saturated alkyl containing 1-10 C atoms, aryl substituted by halogen or one or more C1-C4 alkyl and containing 5-20 C atoms or unsubstituted aryl containing 5-20 C atoms, and
heteroaryl substituted by halogen or one or more C1-C4 alkyl and containing 5-20 C atoms or unsubstituted heteroaryl containing 5-20 C atoms, or
wherein:
adjacent $R_1$-$R_{21}$ are mutually linked to form a ring via a covalent bond.

3. The complex according to claim 2, wherein:
in the 21 groups of the $R_1$-$R_{21}$:
zero to three groups independently represent diarylamino, aryl substituted by halogen or one to three C1-C4 alkyl and containing 5-10 C atoms or unsubstituted aryl containing 5-10 C atoms, N-bearing heteroaryl substituted by halogen or one to three C1-C4 alkyl and containing 5-10 C atoms, or unsubstituted N-bearing heteroaryl containing 5-10 C atoms; and
other groups independently represent hydrogen or saturated alkyl containing 1-8 C atoms; and
the halogen is at least one of F and Cl.

4. The complex according to claim 2, wherein in the 21 groups of the $R_1$-$R_{21}$:
zero to three groups independently represent diphenylamino, phenyl, pyridyl, carbazolyl; and
other groups independently represent hydrogen, fluorine or saturated alkyl containing 1-4 C atoms.

5. The complex according to claim 1, having a structure as shown in the following formula:

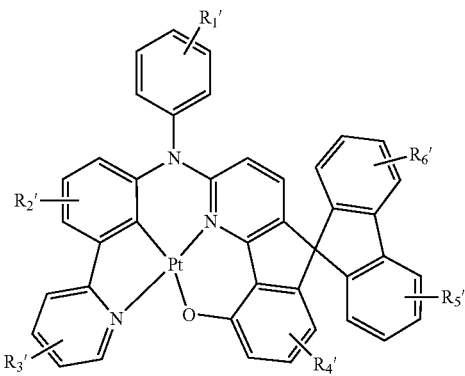

wherein:
$R_1'$-$R_6'$ are independently selected from hydrogen, halogen, diarylamino, saturated alkyl containing 1-10 C atoms, aryl substituted by halogen or one or more C1-C4 alkyl and containing 5-20 C atoms or unsubstituted aryl containing 5-20 C atoms, heteroaryl substituted by halogen or one or more C1-C4 alkyl and containing 5-20 C atoms, and unsubstituted heteroaryl containing 5-20 C atoms;
the halogen is and one of F, Cl, and Br; and
heteroatom in the heteroaryl is any one of N, O and S; or wherein:

adjacent $R_1'$-$R_6'$ are mutually linked to form a ring via a covalent bond.

6. The complex according to claim 5, wherein:

in the six groups of the $R_1'$-$R_6'$:

zero to three groups independently represent diarylamino, aryl substituted by halogen or one to three C1-C4 alkyl and containing 5-10 C atoms or unsubstituted aryl containing 5-10 C atoms, heteroaryl substituted by halogen or one to three C1-C4 alkyl and containing 5-10 C atoms, or unsubstituted heteroaryl containing 5-10 C atoms; and other groups independently represent hydrogen, halogen or saturated alkyl containing 1-8 C atoms; and the halogen is at least one of F and Cl.

7. The complex according to claim 5, wherein in the six groups of the $R_1'$-$R_6'$:

zero to three groups independently represent diphenylamino, C1-C4 alkyl substituted or unsubstituted phenyl, pyridyl, carbazolyl; and other groups independently represent hydrogen, fluorine or saturated alkyl containing 1-4 C atoms.

8. A tetradentate platinum (II) complex, having a structure below:

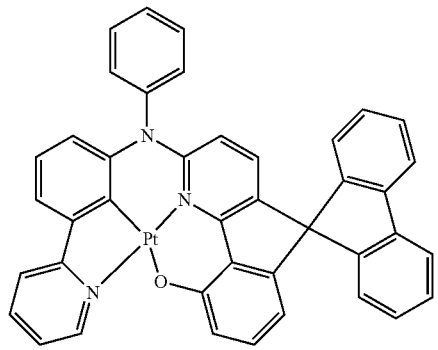

Pt-1

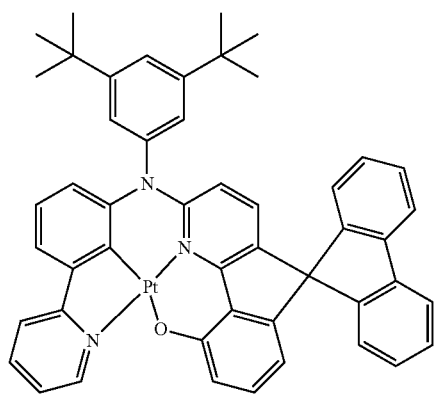

Pt-2

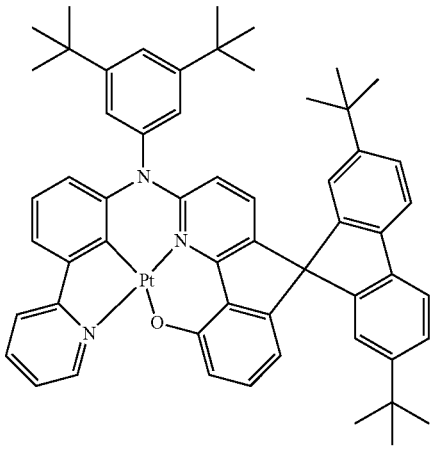

Pt-3

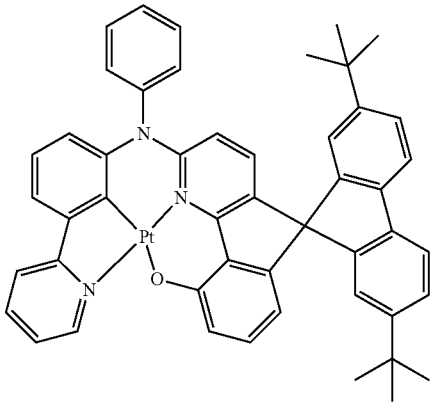

Pt-4

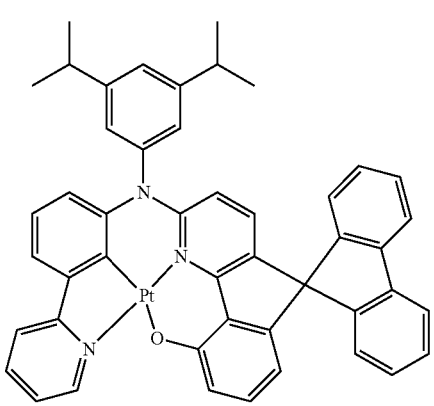

Pt-5

-continued
Pt-6
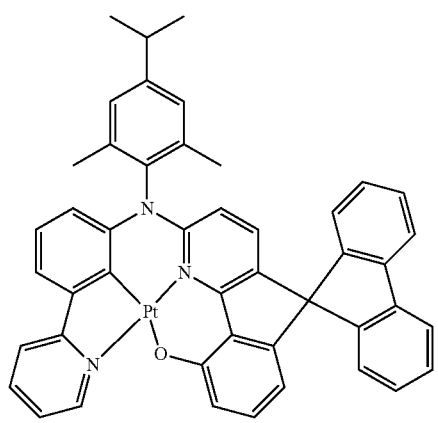
Pt-9
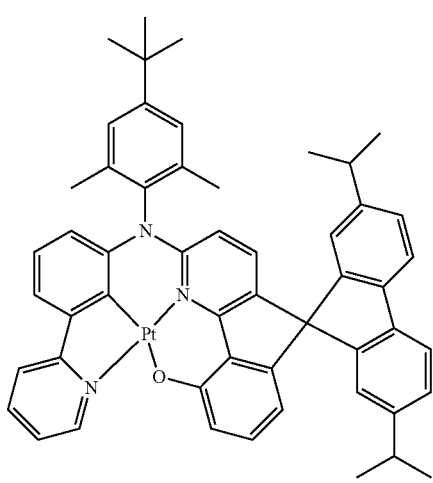
Pt-7
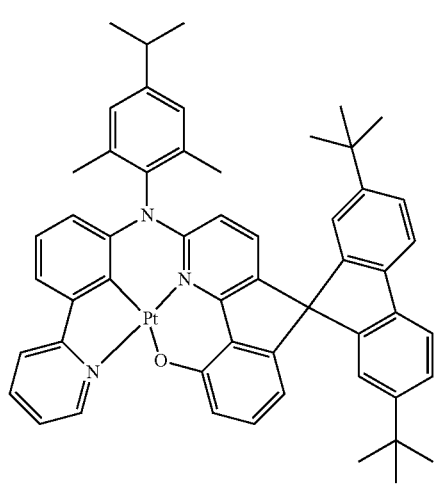
Pt-10
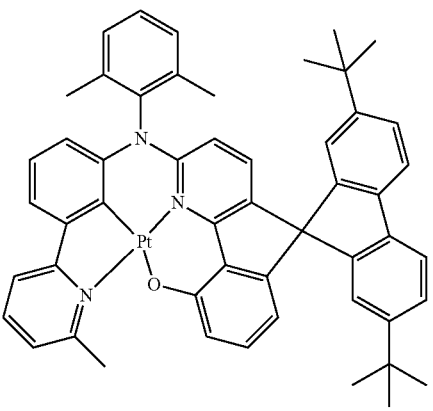
Pt-8
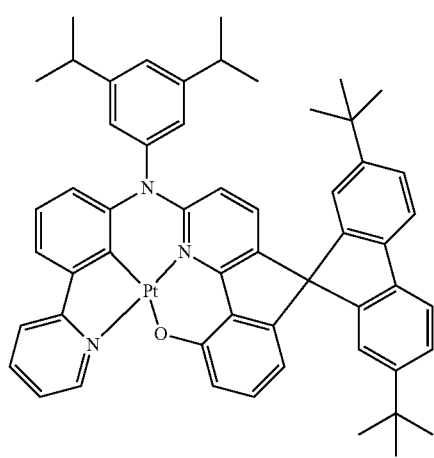
Pt-11
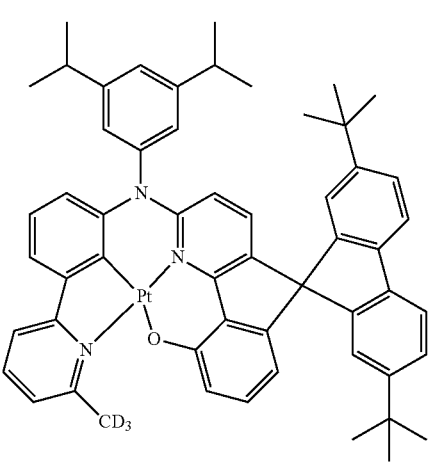

-continued
Pt-12
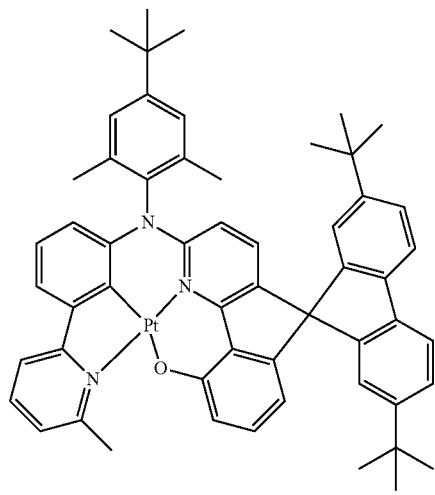
Pt-13
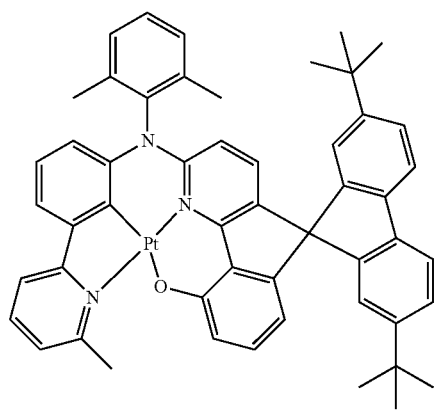
Pt-14
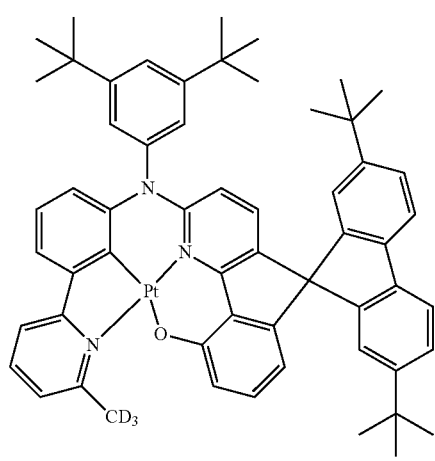
-continued
Pt-15
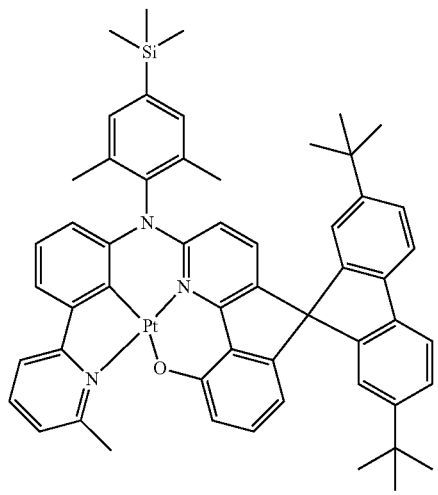
Pt-16
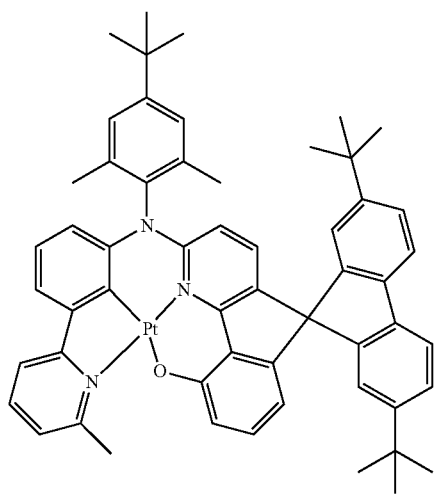
Pt-17
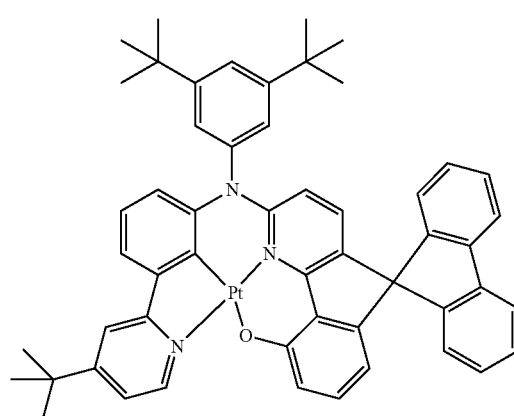

Pt-18
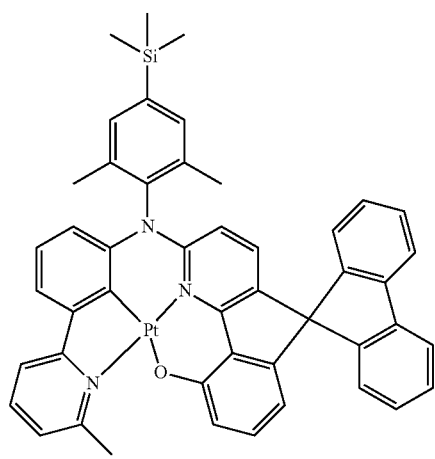
Pt-19
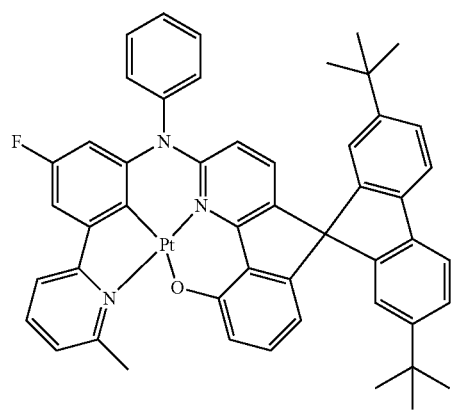
Pt-20
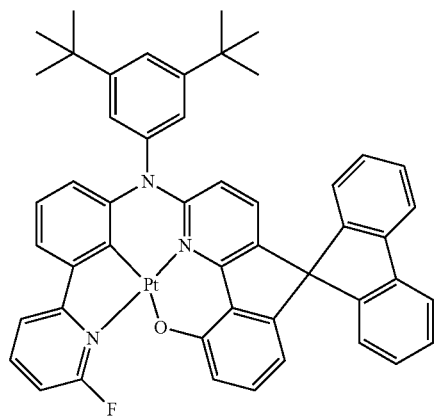
Pt-21
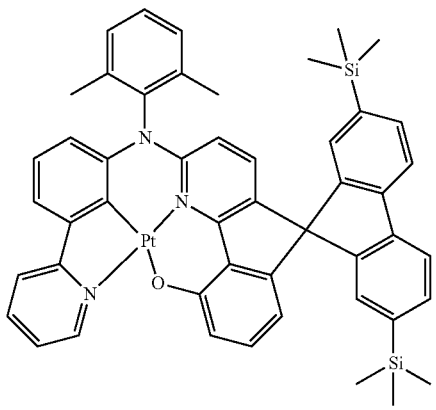
Pt-22
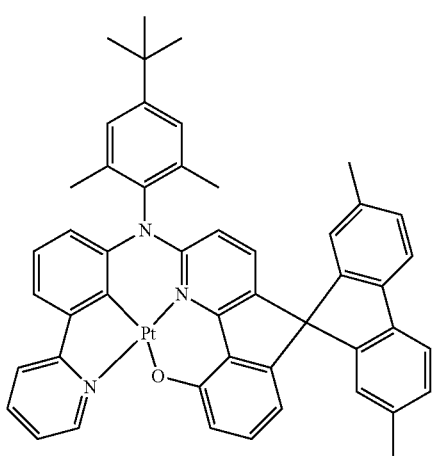
Pt-23
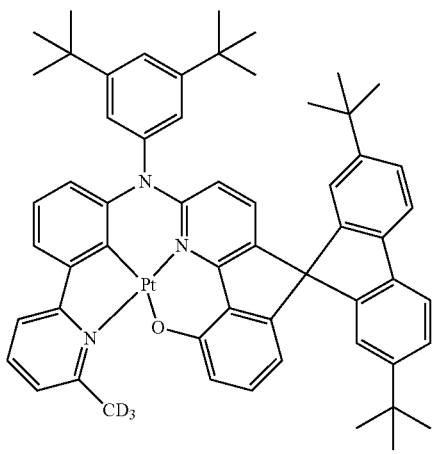

Pt-24
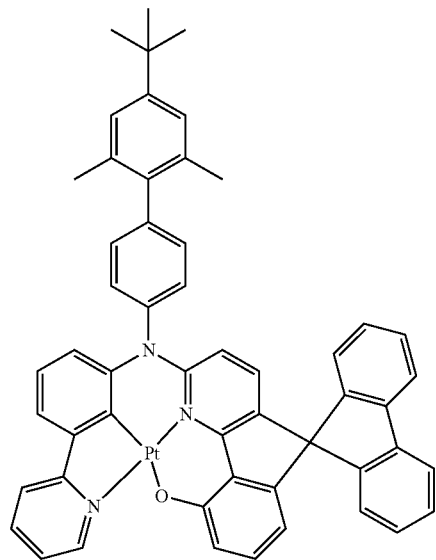
Pt-25
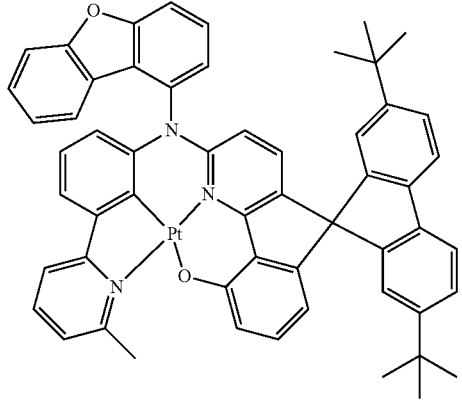
Pt-26
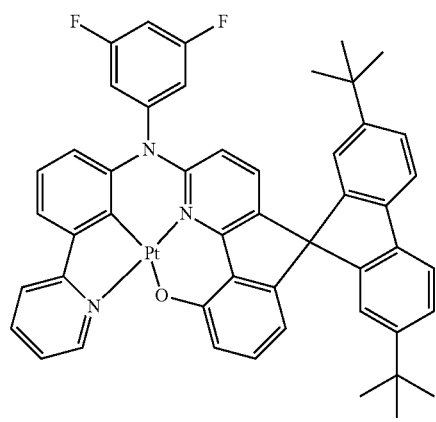
Pt-27
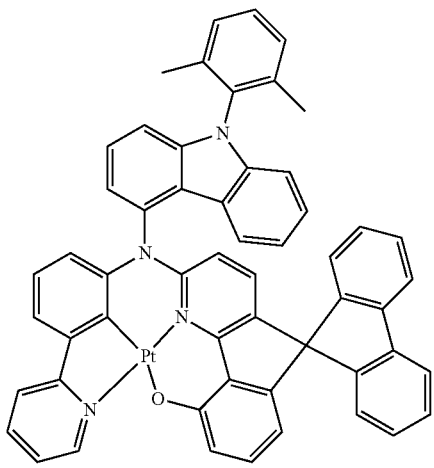
Pt-28
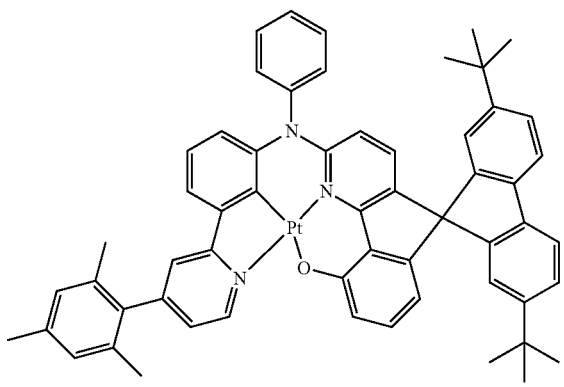
Pt-29
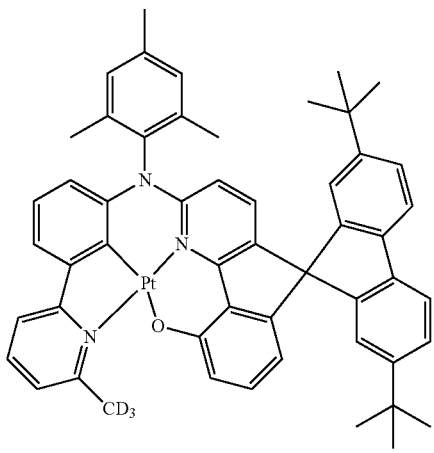

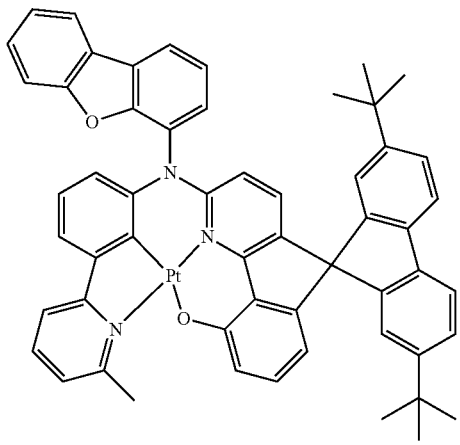

Pt-30

9. A precursor of the complex of claim 1, having a structure as shown in the following formula:

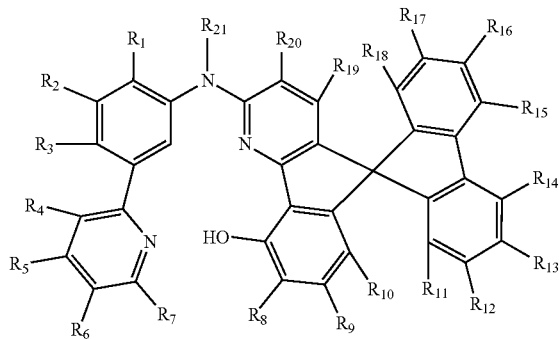

wherein:

$R_1$-$R_{21}$ are independently selected from hydrogen, deuterium, sulfur, halogen, hydroxy, acyl, alkoxy, acyloxy, amino, nitro, acylamino, cyano, carboxyl, styryl, aminocarbonyl, carbamoyl, benzylcarbonyl, aryloxy, diarylamino, saturated alkyl containing 1-30 C atoms, substituted or unsubstituted aryl containing 5-30 C atoms, and substituted or unsubstituted heteroaryl containing 5-30 C atoms;

the substitution refers to a substitution by halogen, deuterium, C1-C20 alkyl, C1-C10 silicyl, and cyano; and heteroatom in the heteroaryl is one or more of N, O and S; or wherein:

adjacent $R_1$-$R_{21}$ are mutually linked to form a ring via a covalent bond.

10. A synthesis method for the tetradentate platinum (II) complex according to claim 5, comprising:

subjecting initial substrates S1 and S2 to Suzuki-Miyaura coupling reaction to obtain a substrate S3;

subjecting the S3 and S4 to Buchwald-Hartwig coupling reaction to obtain a substrate S5;

then subjecting the S5 and S6 to Buchwald-Hartwig coupling reaction to obtain a substrate S7;

heating the S7 at a high temperature under the action of a pyridine hydrochloride for demethylation to obtain an S8; and performing a chelation reaction on the S8 and $K_2PtCl_4$ to obtain a target platinum (II) complex TM:

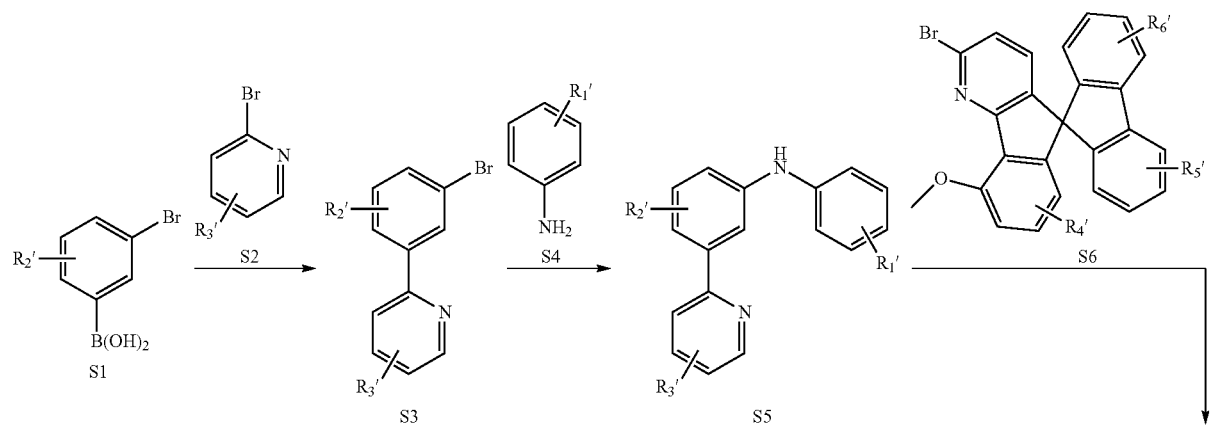

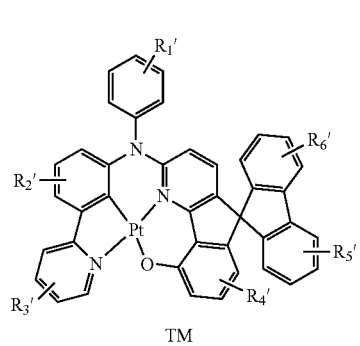 TM

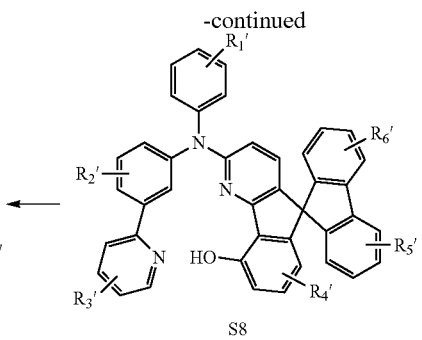 S8

-continued

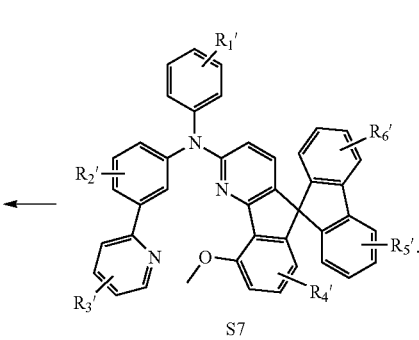 S7

11. An application of the complex of claim 1 in an OLED luminescent device.

12. The application according to claim 11, wherein the complex serves as a phosphorescent doping material having a photon emission effect in a light-emitting layer.

13. An application of the complex of claim 2 in an OLED luminescent device.

14. The application according to claim 13, wherein the complex serves as a phosphorescent doping material having a photon emission effect in a light-emitting layer.

15. An application of the complex of claim 3 in an OLED luminescent device.

16. The application according to claim 15, wherein the complex serves as a phosphorescent doping material having a photon emission effect in a light-emitting layer.

17. An application of the complex of claim 4 in an OLED luminescent device.

18. The application according to claim 17, wherein the complex serves as a phosphorescent doping material having a photon emission effect in a light-emitting layer.

19. An application of the complex of claim 5 in an OLED luminescent device.

20. The application according to claim 19, wherein the complex serves as a phosphorescent doping material having a photon emission effect in a light-emitting layer.

* * * * *